United States Patent
Zhou

(10) Patent No.: US 12,424,983 B2
(45) Date of Patent: Sep. 23, 2025

(54) NON-LINEAR DISTORTION COMPENSATION CIRCUIT, APPARATUS, METHOD, AND ELECTRONIC DEVICE

(71) Applicant: VIVO MOBILE COMMUNICATION CO., LTD., Guangdong (CN)

(72) Inventor: Yao Zhou, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 208 days.

(21) Appl. No.: 18/368,675

(22) Filed: Sep. 15, 2023

(65) Prior Publication Data

US 2024/0022215 A1    Jan. 18, 2024

Related U.S. Application Data

(63) Continuation of application No. PCT/CN2022/081206, filed on Mar. 16, 2022.

(30) Foreign Application Priority Data

Mar. 17, 2021 (CN) .......................... 202110287668.9

(51) Int. Cl.
*H03F 1/32* (2006.01)
*H03F 3/21* (2006.01)
*H04R 3/00* (2006.01)

(52) U.S. Cl.
CPC ............... *H03F 1/32* (2013.01); *H03F 3/21* (2013.01); *H04R 3/00* (2013.01); *H03F 2200/03* (2013.01); *H04R 2430/01* (2013.01)

(58) Field of Classification Search
CPC .......... H03F 1/32; H03F 3/21; H03F 2200/03; H04R 3/00; H04R 2430/01
See application file for complete search history.

(56) References Cited

U.S. PATENT DOCUMENTS 6,005,952 A    12/1999  Klippel
10,090,818 B1  10/2018  Hakkola et al.
(Continued)

FOREIGN PATENT DOCUMENTS

CN    105530571 A    4/2016
CN    109525264 A    3/2019
(Continued)

OTHER PUBLICATIONS

International Search Report and Written Opinion of the International Searching Authority regarding International Patent Application No. PCT/CN2022/081206, dated May 25, 2022. Translation provided by Bohui Intellectual Property.
(Continued)

*Primary Examiner* — David L Ton
(74) *Attorney, Agent, or Firm* — Harness, Dickey & Pierce, P.L.C.

(57) ABSTRACT

A non-linear distortion compensation circuit includes: a first input terminal of a linear dynamic circuit is configured to input an audio signal, and an output terminal is separately connected to a first input terminal of a gain module and a first input terminal of a multiplier; a second input terminal of the gain module is configured to input the audio signal, and an output terminal is connected to a second input terminal of the multiplier; an output terminal of the multiplier is connected to a first input terminal of a non-linear inverse dynamic circuit; a second input terminal of the non-linear inverse dynamic circuit is configured to input the loudspeaker model parameter, and an output terminal is connected to a loudspeaker. A compression gain that is output by the gain module is used to compress, by using the multiplier, a linear signal that is output by the linear dynamic circuit.

18 Claims, 7 Drawing Sheets

(56) References Cited

U.S. PATENT DOCUMENTS

| | | | |
|---|---|---|---|
| 10,356,522 B2 * | 7/2019 | Lawrence | .............. H04R 3/007 |
| 2002/0057808 A1 | 5/2002 | Goldstein | |
| 2014/0254805 A1 * | 9/2014 | Su | .......................... H04R 3/007 |
| | | | 381/55 |
| 2016/0014508 A1 * | 1/2016 | Su | .......................... H04R 3/007 |
| | | | 381/55 |
| 2016/0111110 A1 | 4/2016 | Gautama | |
| 2016/0351202 A1 | 12/2016 | Baumgarte | |
| 2018/0160235 A1 | 6/2018 | Lesso et al. | |

FOREIGN PATENT DOCUMENTS

| | | | | |
|---|---|---|---|---|
| CN | 111741408 A | | 10/2020 | |
| CN | 111741409 A | | 10/2020 | |
| CN | 113162555 A | | 7/2021 | |
| EP | 3010251 B1 | * | 11/2019 | ......... G10L 21/0316 |
| JP | 2014090285 A | * | 5/2014 | |
| WO | WO-2007013622 A1 | * | 2/2007 | ............... H04R 3/08 |
| WO | WO-2009093396 A1 | * | 7/2009 | ........... H03F 1/3241 |

OTHER PUBLICATIONS

First Office Action regarding Chinese Patent Application No. 2021102876689, dated Jul. 29, 2023. Translation provided by Bohui Intellectual Property.

* cited by examiner

NON-LINEAR DISTORTION COMPENSATION CIRCUIT, APPARATUS, METHOD, AND ELECTRONIC DEVICE

CROSS-REFERENCE TO RELATED APPLICATIONS

This application is a Bypass Continuation application of PCT/CN2022/081206 filed on Mar. 16, 2022, which claims priority to Chinese Patent Application No. 202110287668.9 filed on Mar. 17, 2021, which are incorporated herein by reference in their entirety.

TECHNICAL FIELD

This application pertains to the field of communications technologies, and in particular, to a non-linear distortion compensation circuit, apparatus, method, and an electronic device.

BACKGROUND

The loudspeaker is a non-linear system, and when playing low-frequency and high-volume signals, the system distortion is obvious.

SUMMARY

Embodiments of this application aim to provide a non-linear distortion compensation circuit, apparatus, method, and an electronic device.

According to a first aspect, an embodiment of this application provides a non-linear distortion compensation circuit, where the non-linear distortion compensation circuit includes: a linear dynamic circuit, a gain module, a multiplier, and a non-linear inverse dynamic circuit; and a first input terminal of the linear dynamic circuit is configured to input an audio signal, a second input terminal of the linear dynamic circuit is configured to input a loudspeaker model parameter, and an output terminal of the linear dynamic circuit is separately connected to a first input terminal of the gain module and a first input terminal of the multiplier; a second input terminal of the gain module is configured to input the audio signal, a third input terminal of the gain module is configured to input the loudspeaker model parameter, and an output terminal of the gain module is connected to a second input terminal of the multiplier; an output terminal of the multiplier is connected to a first input terminal of the non-linear inverse dynamic circuit; and a second input terminal of the non-linear inverse dynamic circuit is configured to input the loudspeaker model parameter, and an output terminal of the non-linear inverse dynamic circuit is connected to a loudspeaker, where the output terminal of the linear dynamic circuit is configured to output a linear signal, the output terminal of the gain module is configured to output a compression gain, the output terminal of the non-linear inverse dynamic circuit is configured to output a predistortion signal, the compression gain is used to compress the linear signal by using the multiplier, and the compression gain is a positive number less than or equal to 1.

According to a second aspect, an embodiment of this application provides a non-linear distortion compensation apparatus, and the non-linear distortion compensation apparatus includes the non-linear distortion compensation circuit according to the first aspect.

According to a third aspect, an embodiment of this application provides an electronic device, and the electronic device includes the non-linear distortion compensation circuit according to the first aspect.

According to a fourth aspect, an embodiment of this application provides a non-linear distortion compensation method, and the method includes: generating a linear signal based on an audio signal and a loudspeaker model parameter; generating a compression gain based on the audio signal, the loudspeaker model parameter, and the linear signal; calculating a product of the linear signal and the compression gain; and generating a predistortion signal based on the loudspeaker model parameter and the product, w % here the compression gain is a positive integer less than or equal to 1.

According to a fifth aspect, an embodiment of this application provides a non-linear distortion compensation apparatus, and the non-linear distortion compensation apparatus includes a generating module and a calculation module; the generating module is configured to: generate a linear signal based on an audio signal and a loudspeaker model parameter; and generate a compression gain based on the audio signal, the loudspeaker model parameter, and the linear signal; the calculation module is configured to calculate a product of the linear signal and the compression gain; and the generating module is further configured to generate a predistortion signal based on the loudspeaker model parameter and the product, where the compression gain is a positive integer less than or equal to 1.

According to a sixth aspect, an embodiment of this application provides an electronic device, where the electronic device includes a processor, a memory, and a program or an instruction stored in the memory and executable on the processor, and when the program or the instruction is executed by the processor, steps of the method according to the third aspect are implemented.

According to a seventh aspect, an embodiment of this application provides a non-transitory readable storage medium, where the non-transitory readable storage medium stores a program or an instruction, and when the program or the instruction is executed by a processor, steps of the method according to the third aspect are implemented.

According to an eighth aspect, an embodiment of this application provides a chip, where the chip includes a processor and a communications interface, the communications interface is coupled to the processor, and the processor is configured to run a program or an instruction to implement the method according to the third aspect.

DESCRIPTION OF EMBODIMENTS

Figure 1:
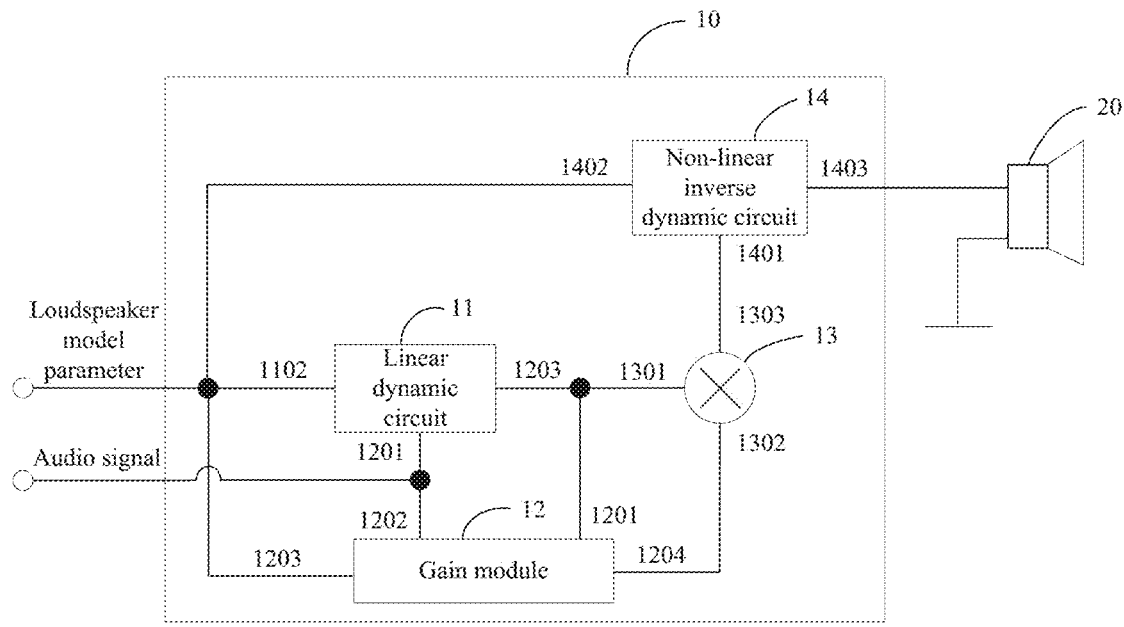
FIG. 1 is a first schematic diagram of composition of a non-linear distortion compensation circuit according to an embodiment of this application.

The following clearly describes technical solutions in the embodiments of this application with reference to the accompanying drawings in the embodiments of this application. Apparently, the described embodiments are some but not all of the embodiments of this application. All other embodiments obtained by a person of ordinary skill in the art based on the embodiments of this application shall fall within the protection scope of this application.

The terms "first", "second", and the like in the description and the claims of this application are used to distinguish between similar objects, and do not need to be used to describe a specific order or sequence. It should be understood that, data used in such a way is interchangeable in proper circumstances, so that the embodiments of this application can be implemented in an order other than the order illustrated or described herein. Objects classified by "first", "second", and the like are usually of a same type, and the quantity of objects is not limited. For example, there may be one or more first objects. In addition, in the specification and the claims, "and/or" represents at least one of connected objects, and a character "/" generally represents an "or" relationship between associated objects.

In the embodiments of this application, words such as "exemplary" or "for example" are used to indicate an example, an instance, or descriptions. Any embodiment or design scheme described as "an example of" or "for example" in the embodiments of this application should not be explained as being more preferred or having more advantages than another embodiment or design scheme. To be precise, the use of the term such as "exemplary" or "for example" is intended to present a related concept in a specific manner.

In the descriptions of the embodiments of this application, unless otherwise stated. "a plurality of" means two or more, for example, a plurality of processing units mean two or more processing units, and a plurality of elements mean two or more elements.

It should be noted that the identifier in this embodiment of this application is used to indicate a character, a symbol, an image, and the like of information. A control or another container may be used as a carrier for displaying the information, including but not limited to a character identifier, a symbol identifier, and an image identifier.

The loudspeaker is a non-linear system, and when playing low-frequency and high-volume signals, the system distortion is obvious.

At present, a common method to solve the above problem is to compensate the non-linearity of the speaker system by using a simplified feed-forward controller, so that the speaker becomes a linear system to reduce distortion thereof. The simplified feed-forward controller includes a linear dynamic circuit and a non-linear inverse dynamic circuit, where the linear dynamic circuit is configured to predict a linear amplitude of the loudspeaker, and the non-linear inverse dynamic circuit is configured to calculate a predistortion signal based on the linear amplitude, and the predistortion signal is used to cancel non-linear distortion of the loudspeaker system.

However, the linear dynamic circuit is a simple linear amplitude model, so there is a great difference between the linear amplitude and a real amplitude of the speaker. Thus, the predistortion signal obtained by the non-linear inverse dynamic circuit through calculation is easy to be too large and be cut off.

At present, a simplified feed-forward controller includes only a linear dynamic circuit and a non-linear inverse dynamic circuit. The linear dynamic circuit is a simple linear amplitude model, so there is a great difference between a linear amplitude and a real amplitude of a speaker. Thus, a predistortion signal obtained by the non-linear inverse dynamic circuit through calculation is easy to be too large and be cut off. A feed-forward controller based on state feedback includes a linear dynamic circuit, a non-linear inverse dynamic circuit, and a state predictor. Because an amplitude feedback method is used, it is necessary for instruments to read an amplitude and feed the amplitude back to the feed-forward controller, which makes an operation process complicated and unrealistic.

To solve the above technical problem, an embodiment of this application provides a non-linear distortion compensation circuit. By adding a gain module, a compression gain that is output by the gain module can compress the linear signal (a linear signal that is output by an output terminal of the linear dynamic circuit) by using the multiplier to obtain a signal that makes the predistortion signal (a predistortion signal that is output by an output terminal of the non-linear inverse dynamic circuit) not be cut off, thus solving the problem that the predistortion signal obtained by the existing simplified feed-forward controller is easy to be cut off. The operation process is simple, and calculation costs can be reduced.

An embodiment of this application provides a non-linear distortion compensation circuit, and FIG. 1 shows the non-linear distortion compensation circuit provided in this embodiment of this application. As shown in FIG. 1, the non-linear distortion compensation circuit 10 may include: a linear dynamic circuit 11, a gain module 12, a multiplier 13, and a non-linear inverse dynamic circuit 14.

A first input terminal 1101 of the linear dynamic circuit 11 is configured to input an audio signal, a second input terminal 1102 of the linear dynamic circuit 11 is configured to input a loudspeaker model parameter, and an output terminal 1103 of the linear dynamic circuit 11 is separately connected to a first input terminal 1201 of the gain module 12 and a first input terminal 1301 of the multiplier 13, a second input terminal 1202 of the gain module 12 is configured to input the audio signal, a third input terminal 1203 of the gain module 12 is configured to input the loudspeaker model parameter, and an output terminal 1204 of the gain module 12 is connected to a second input terminal 1302 of the multiplier 13; an output terminal 1303 of the multiplier 13 is connected to a first input terminal 1401 of the non-linear inverse dynamic circuit 14; and a second input terminal 1402 of the non-linear inverse dynamic circuit 14 is configured to input the loudspeaker model parameter, and an output terminal 1403 of the non-linear inverse dynamic circuit 14 is connected to a loudspeaker 20.

The output terminal 1203 of the linear dynamic circuit 11 is configured to output a linear signal, the output terminal 1204 of the gain module 12 is configured to output a compression gain, the output terminal 1403 of the non-linear inverse dynamic circuit 14 is configured to output a predistortion signal, and the compression gain is used to compress the linear signal by using the multiplier 13, so that a signal that makes the predistortion signal not be cut off can be obtained. The compression gain is a positive number less than or equal to 1. In this embodiment of this application, the linear dynamic circuit can also be referred to as linear dynamics.

It can be understood that in this embodiment of this application, the audio signal can be a digital audio signal, and in this embodiment of this application, the audio signal can be converted into an output voltage based on power amplifier information. For details, refer to the description of related technologies, and this is not limited in this embodiment of this application.

It can be understood that in this embodiment of this application, the loudspeaker model parameter is a model parameter of the loudspeaker. Because it is a feed-forward processing system, it is necessary to know the model parameter of the speaker in advance. The loudspeaker model parameter includes a linear parameter and a non-linear parameter, which are all realized through off-line modeling, so that the speaker can accurately calculate an output signal of the system. However, due to the error of the consistency of the speaker, there is still some error in a final output signal. For descriptions of the speaker model parameter, refer to descriptions of related technologies, and this is not limited in this embodiment of this application.

It can be understood that in this embodiment of this application, the linear dynamic circuit aims to keep linearity of the output signal regardless of the size of the input signal. The linear signal that is output by the linear dynamic circuit is compressed by the compression gain to obtain a target signal, the target signal is an ideal input of the non-linear inverse dynamic circuit, and this signal is a reference signal of the non-linear inverse dynamic circuit, and the non-linear inverse dynamic circuit may reversely calculate and output a predistortion voltage signal (namely, the predistortion signal) based on this ideal input.

It can be understood that in this embodiment of this application, the gain module is configured to generate the compression gain based on the audio signal, the speaker model parameter, and the linear signal.

Optionally, in this embodiment of this application, because the output amplitude of the linear dynamic circuit is linear and inaccurate, we need to give the linear amplitude a gain (namely, the compression gain). The gain module may simulate and generate a non-linear amplitude of the speaker based on the audio signal and the speaker model parameter, and then generate the compression gain based on the non-linear amplitude and the linear amplitude in the linear signal.

For example, the non-linear parameter may be added by referring to a process that the linear dynamic circuit simulates the linear signal, and then the non-linear amplitude is simulated and generated.

Optionally, in this embodiment of this application, the gain module may select a corresponding compression gain from a compression gain table based on the audio signal, the loudspeaker model parameter, and the linear signal, where the compression gain table may be generated based on a lot of experimental data.

It can be understood that the non-linear inverse dynamic circuit converts the input signal including the speaker model parameter (the linear parameter and the non-linear parameter) and the target signal into an output signal, the output signal is the predistortion signal, and the predistortion signal is output to the speaker system through digital to analog and power amplifier, with the purpose of canceling non-linear distortion of the speaker system. As a matter of fact, the speaker system is a non-linear system with a nickname of the non-linear inverse dynamic circuit. In this embodiment of this application, the non-linear inverse dynamic circuit can also be referred to as non-linear inverse dynamics.

Figure 2:
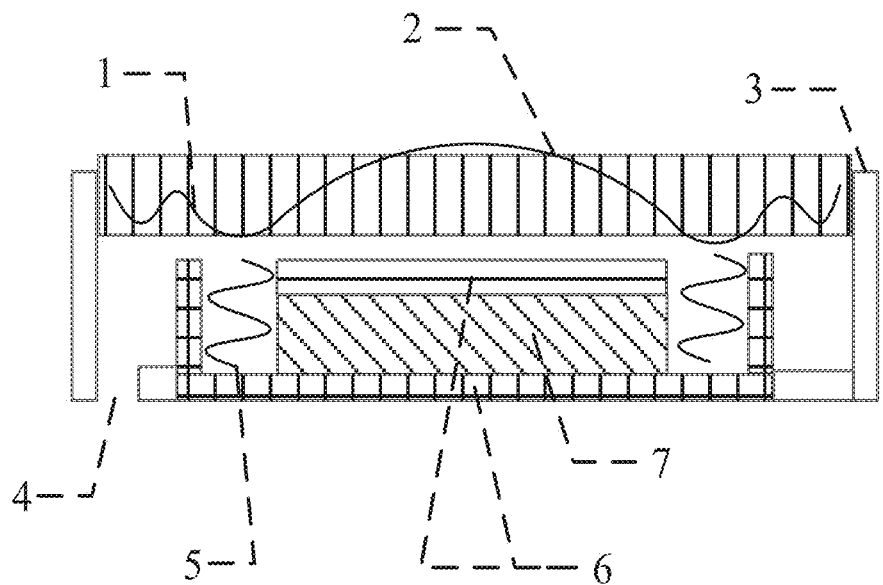
FIG. 2 is a schematic diagram of a structure of a microspeaker according to an embodiment of this application.

Refer to FIG. 2, an embodiment of this application provides a possible structure of a speaker. As shown in FIG. 2, the loudspeaker is a micro-loudspeaker, and the micro-loudspeaker includes a suspension 1, a vibrating diaphragm 2, a frame 3, an opening 4, a voice coil 5, a magnetic path 6, a magnet 7, and the like. An operating principle of the micro-speaker is that the voice coil is wound on a magnet, a magnetic field generated by the magnet is fixed, when alternating current passes through the voice coil, an alternating magnetic field is generated, and the magnetic force causes the voice coil to push the vibrating diaphragm to vibrate and produce sound. A structure of a large speaker is slightly different from that of the micro-speaker, but operating principles thereof are the same.

In this embodiment of this application, a gain module is added on the basis of a simplified feed-forward controller, and a compression gain that is output by the gain module can compress the linear signal (a linear signal that is output by an output terminal of the linear dynamic circuit) by using the multiplier to obtain a signal that makes the predistortion signal (a predistortion signal that is output by an output terminal of the non-linear inverse dynamic circuit) not be cut off, thus solving the problem that the predistortion signal obtained by the existing simplified feed-forward controller is easy to be cut off.

Figure 3:
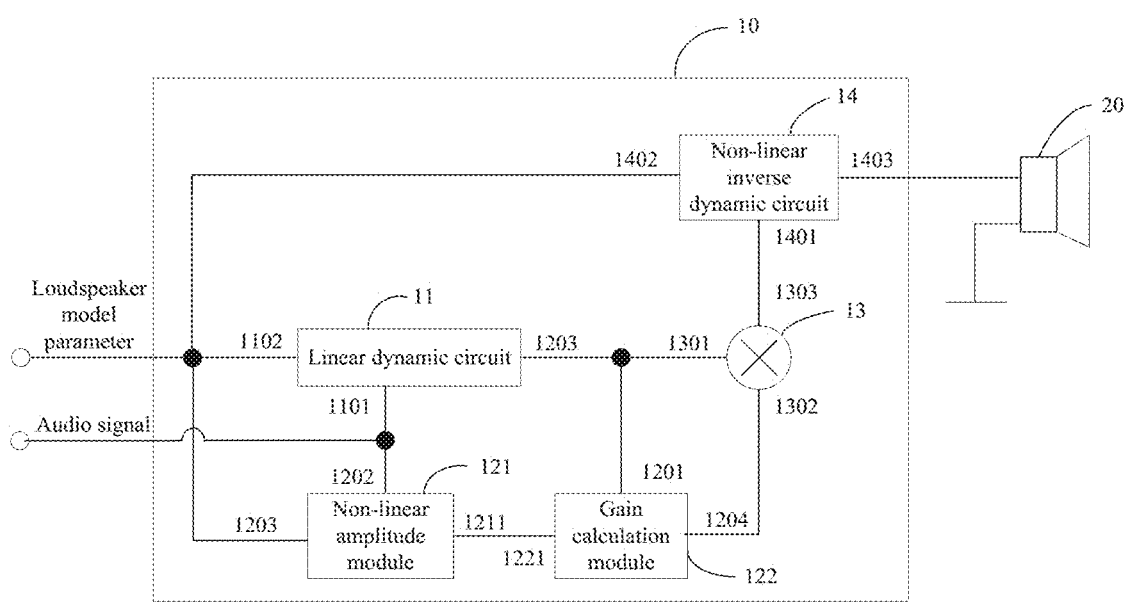
FIG. 3 is a second schematic diagram of composition of a non-linear distortion compensation circuit according to an embodiment of this application.

Optionally, as shown in FIG. 3, the gain module 12 includes a non-linear amplitude module 121 and a gain calculation module 122; two input terminals of the non-linear amplitude module 121 are a second input terminal 1202 of the gain module 12 and a third input terminal 1203 of the gain module 12, and an output terminal 1211 of the non-linear amplitude module 121 is connected to one input terminal 1221 of the gain calculation module 122; and another input terminal of the gain calculation module 122 is the first input terminal 1201 of the gain module 12, and an output terminal of the gain calculation module 122 is an output terminal 1104 of the gain module 11, where the output terminal 1211 of the non-linear amplitude module 121 is configured to output a non-linear amplitude, and the gain calculation module 122 is configured to obtain the compression gain through calculation based on a linear amplitude of the linear signal and the non-linear amplitude.

It can be understood that in this embodiment of this application, there is the non-linear amplitude module with inputs of the audio signal (voltage) and the loudspeaker model parameter and with an output of an amplitude (and the non-linear amplitude) of the vibrating diaphragm of the loudspeaker. The module may simulate the non-linearity of loudspeaker system, accurately calculate the amplitude of loudspeaker system, and provide reference for the output amplitude of the linear dynamic circuit. Because the amplitude calculated by the linear dynamic circuit is linear and inaccurate, a distortion signal calculated by the non-linear inverse dynamic circuit may be cut off, and the input and the output of the system are inconsistent. Introduction of the non-linear amplitude module can effectively solve this consistency problem. In this embodiment of this application, the non-linear amplitude module can also be referred to as a non-linear amplitude model.

It can be understood that in this embodiment of this application, the gain calculation module performs calculation based on the non-linear amplitude (which is calculated by the non-linear amplitude module) and the linear amplitude of the linear signal (which is calculated by the linear dynamic circuit).

For example, the process that the gain calculation module calculates the compression gain includes the following step 101 to step 107.

Step 101. The gain calculation module obtains the linear amplitude.

Step 102. The gain calculation module obtains a maximum positive amplitude (a maximum amplitude above an equilibrium position) and a maximum negative amplitude (a maximum amplitude below the equilibrium position) in the linear amplitude.

Step 103. The gain calculation module defines a historical data cache 1, stores the two maximum values obtained in step 102, and then outputs a maximum value in all amplitudes in the historical data (recorded as a maximum linear amplitude) to 107.

Step 104. The gain calculation module obtains the non-linear amplitude.

Step 105. The gain calculation module obtains a maximum positive amplitude (a maximum amplitude above an equilibrium position) and a maximum negative amplitude (a maximum amplitude below the equilibrium position) in the non-linear amplitude.

Step 106. The gain calculation module defines a historical data cache 2, stores the two maximum values obtained in step 105, and outputs a maximum value in all amplitudes in the historical data (recorded as a maximum non-linear amplitude) to 107.

Step 107. The gain calculation module calculates a ratio of the maximum non-linear amplitude to the maximum linear amplitude as the compression gain.

It can be understood that in this embodiment of this application, the compression gain is a value greater than 0 and less than or equal to 1, so the compression gain is a smaller number divided by a larger number in the maximum non-linear amplitude and the maximum linear amplitude.

It should be noted that in this embodiment of this application, the amplitudes are scalar, so the amplitudes are all positive numbers.

Optionally, in this embodiment of this application, the maximum linear amplitude may be a value, that is, the maximum linear amplitude is a maximum value in all positive amplitudes and all negative amplitudes stored in the historical data cache 1; the maximum non-linear amplitude may be a value, that is, the maximum non-linear amplitude is a maximum value in all positive amplitudes and all negative amplitudes stored in the historical data cache 2; and the compression gain is the ratio of the maximum non-linear amplitude to the maximum linear amplitude.

Optionally, in this embodiment of this application, the maximum linear amplitude may be two values, that is, the maximum linear amplitude includes a maximum value 1 in all positive amplitudes and a maximum value 2 in all negative amplitudes stored in the historical data cache 1; and the maximum non-linear amplitude may be two values, that is, the maximum non-linear amplitude includes a maximum value 3 in all positive amplitudes and a maximum value 4 in all negative amplitudes stored in the historical data cache 2.

The compression gain is a smaller value of a ratio 1 and a ratio 2, where the ratio 1 is a ratio of the maximum value 3 to the maximum value 1, and the ratio 2 is a ratio of the maximum value 4 to the maximum value 2.

It should be noted that before outputting the compression gain, in this embodiment of this application, a compression gain value that is obtained by calculation needs to be smoothed, so as to avoid sudden change of the compression gain and make the output compression gain gradual. Then the gain calculation module outputs the compression gain to the multiplier, so as to suppress the linear signal (linear amplitude) that is output by the linear dynamic circuit, and obtain the target signal for the non-linear inverse dynamic circuit as the input signal.

Figure 4:
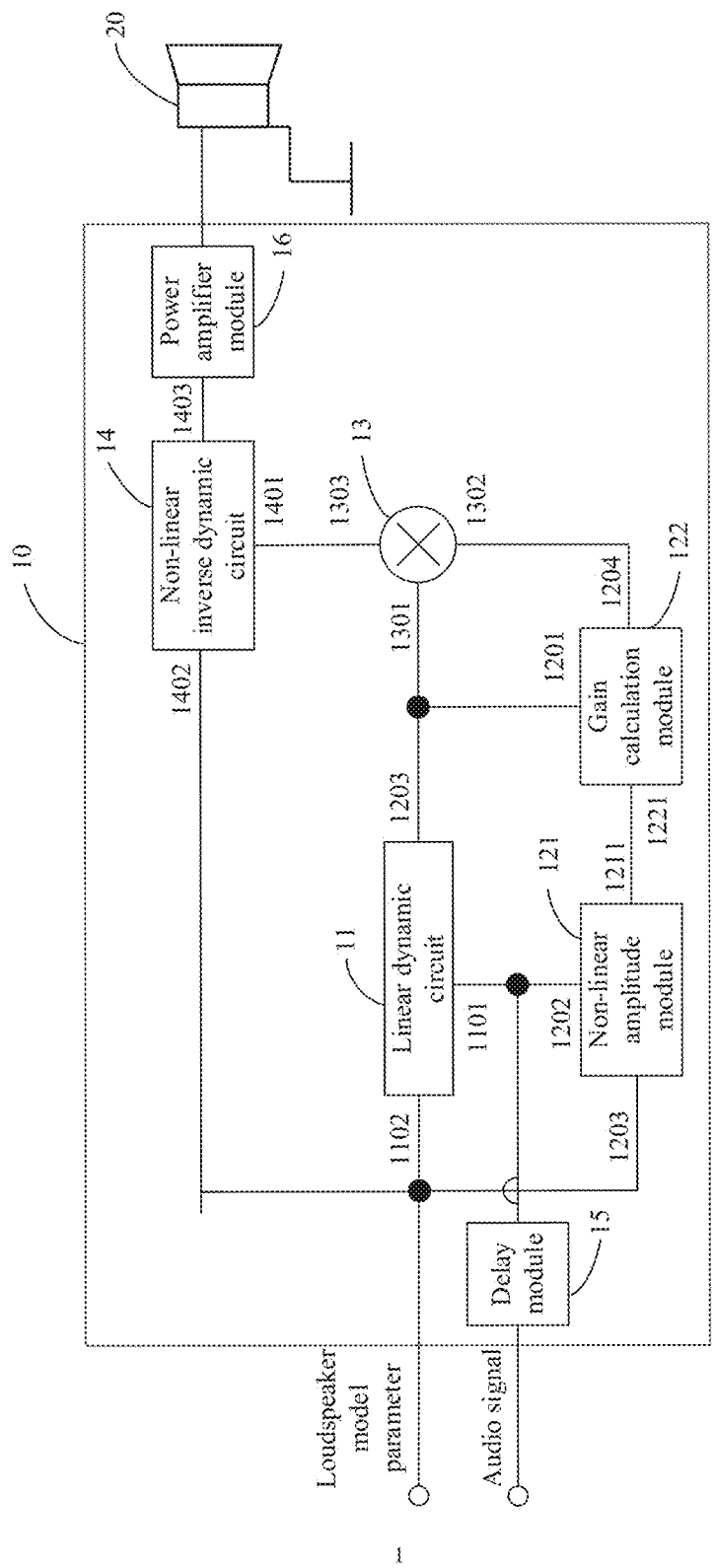
FIG. 4 is a third schematic diagram of composition of a non-linear distortion compensation circuit according to an embodiment of this application.

Optionally, as shown in FIG. 4, the non-linear distortion compensation circuit 10 further includes at least one of the following: a delay module 15 or a power amplifier module 16; after passing through the delay module 15, the audio signal is input to the first input terminal of the linear dynamic circuit 11 and the second input terminal of the gain module 12; and the output terminal of the non-linear inverse dynamic circuit 14 is connected to the loudspeaker 20 through the power amplifier module 16.

It can be understood that in this embodiment of this application, the delay module is configured to perform delay buffer on the audio signal, a frame length is N milliseconds, and N is a positive integer.

It can be understood that in this embodiment of this application, the power amplifier module boosts an input analog signal based on an analog gain, which is finally driven and output to the speaker. It should be noted that there is a digital-to-analog converter (DAC) before the power amplifier module to convert a digital signal (the predistortion signal) into an analog signal.

Figure 5:
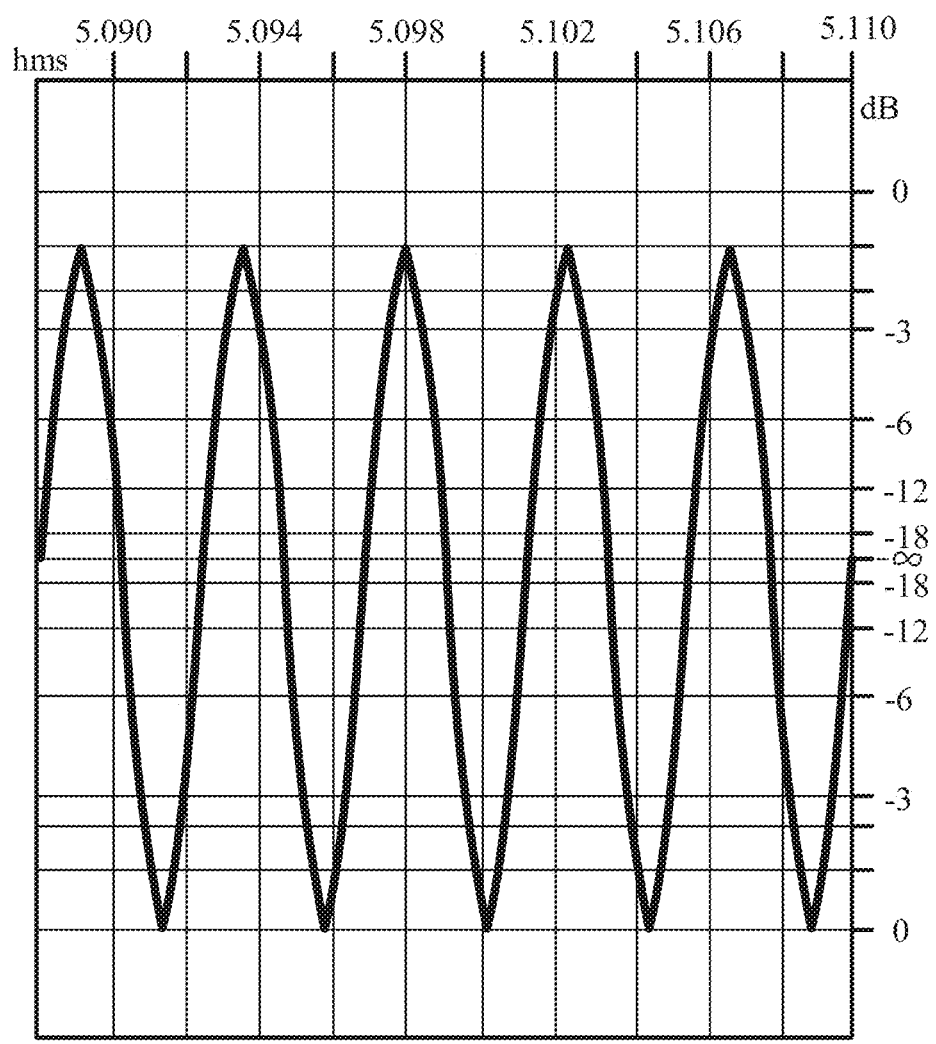
FIG. 5 is a diagram of an audio signal that is output by a loudspeaker compensated by using a non-linear distortion compensation circuit according to an embodiment of this application.
Figure 6:
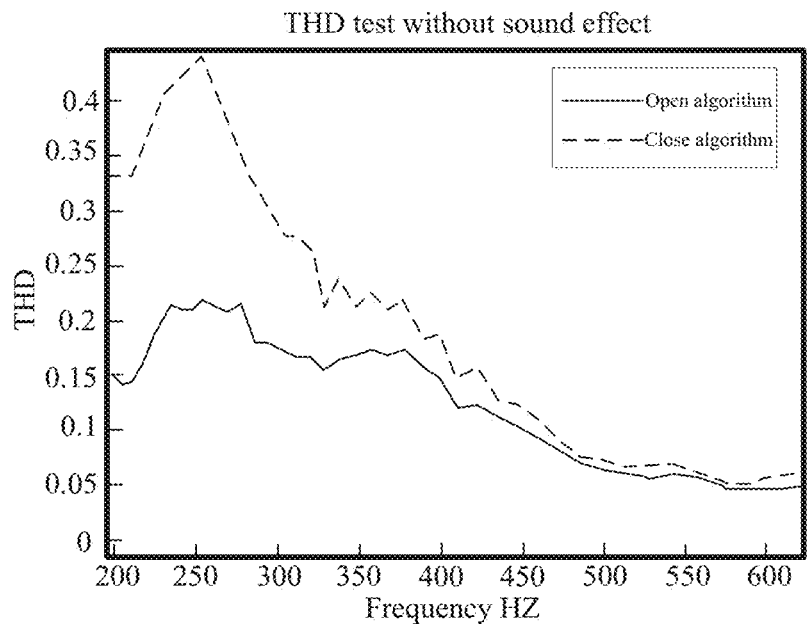
FIG. 6 is a total harmonic distortion effect diagram of a loudspeaker compensated by using a non-linear distortion compensation circuit according to an embodiment of this application.

For example, through the non-linear distortion compensation circuit provided in this embodiment of this application, a sound source (an audio signal) of 0 dB and 300 Hz is input, and finally the loudspeaker system outputs a signal as shown in FIG. 5. It can be learned from FIG. 5 that first, the output is not cut off, and second, there is a 1 dB difference in a forward signal, which is a normal phenomenon, because the non-linearity of the loudspeaker system will make the signal offset, and non-linear inverse dynamic circuit output of the loudspeaker will also be offset. Through the non-linear distortion compensation circuit provided in this embodiment of this application, a measured effect of total harmonic distortion (THD) is shown in FIG. 6. With −3 dB sound source played, the solid line is the THD of an open algorithm and the dashed line is the THD of a close algorithm. It can be clearly seen from FIG. 6 that the THD of the open algorithm is obviously reduced, and the effect is the best in a low frequency region, which can be reduced by once. Therefore, the non-linear distortion compensation circuit provided in this embodiment of this application is configured to compensate the loudspeaker, so that the distortion of the loudspeaker system can be reduced.

An embodiment of this application provides a non-linear distortion compensation apparatus, and the non-linear distortion compensation apparatus includes the non-linear distortion compensation circuit 10 described in the foregoing embodiment. For example, reference can be made to the related description of the non-linear distortion compensation circuit shown in FIG. 1 to FIG. 6 in the foregoing embodiments.

An embodiment of this application provides an electronic device, and the electronic device includes the non-linear distortion compensation circuit in the foregoing embodiment. For example, reference can be made to related description of the non-linear distortion compensation circuit shown in FIG. 1 to FIG. 6 in the foregoing embodiments. Details are not described herein again.

Optionally, in this embodiment of this application, the electronic device may include at least one non-linear distortion compensation circuit described in the foregoing embodiment, and for each non-linear distortion compensation circuit, the electronic device further includes one audio input apparatus and one compensated speaker.

Figure 7:
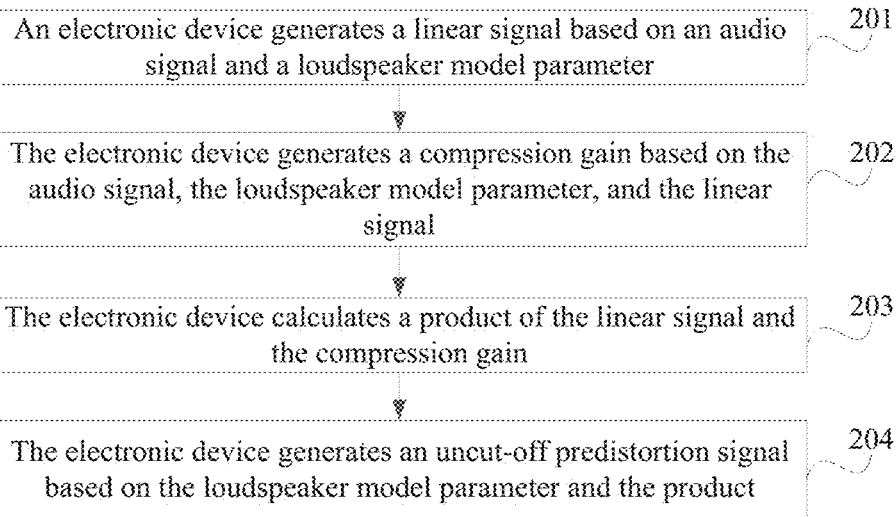
FIG. 7 is a flowchart of a non-linear distortion compensation method according to an embodiment of this application.

Refer to FIG. 7, an embodiment of this application provides a non-linear distortion compensation method, and an execution body of the non-linear distortion compensation method may be a non-linear distortion compensation apparatus or an electronic device, or the like. The following uses an example in which the execution body is the electronic device to illustrate the non-linear distortion compensation method provided in this embodiment of this application. The method may include the following step 201 to step 204.

Step 201. The electronic device generates a linear signal based on an audio signal and a loudspeaker model parameter.

Step 202. The electronic device generates a compression gain based on the audio signal, the loudspeaker model parameter, and the linear signal.

The compression gain is a positive integer less than or equal to 1.

Step 203. The electronic device calculates a product of the linear signal and the compression gain.

Step 204. The electronic device generates a predistortion signal based on the loudspeaker model parameter and the product.

It should be noted that in this embodiment of this application, step 201 is corresponding to the linear dynamic circuit in the foregoing embodiment, step 202 is corresponding to the gain module in the foregoing embodiment, step 203 is corresponding to the multiplier in the foregoing embodiment, step 204 is corresponding to the non-linear inverse dynamic circuit in the foregoing embodiment, and the product is the target signal in the foregoing embodiment.

Optionally, in this embodiment of this application, step 202 can be implemented through the following step 202a and step 202b.

Step 202a. The electronic device generates a non-linear amplitude based on the audio signal and the loudspeaker model parameter.

Step 202b. The electronic device generates the compression gain based on a linear amplitude of the linear signal and the non-linear amplitude.

It should be noted that in this embodiment of this application, step 202a is corresponding to the non-linear amplitude module in the foregoing embodiment, and step 202b is corresponding to the gain calculation module in the foregoing embodiment.

Optionally, step 202b can be implemented through the following step 202b1 to step 202b3.

Step 202b1. The electronic device obtains a maximum linear amplitude based on the linear amplitude and a historical linear amplitude.

Step 202b2. The electronic device obtains a maximum non-linear amplitude based on the non-linear amplitude and a historical non-linear amplitude.

Step 202b3. The electronic device calculates a ratio of the maximum non-linear amplitude to the maximum linear amplitude as the compression gain.

It should be noted that, for a process of the non-linear distortion compensation method provided in this embodiment of this application, refer to the relevant description of the non-linear distortion compensation circuit in the foregoing embodiment, and a same technical effect can be achieved. To avoid repetition, details are not described herein again.

In this embodiment of this application, the linear signal may be generated based on the audio signal and the loudspeaker model parameter; the compression gain is generated based on the audio signal, the loudspeaker model parameter, and the linear signal; the product of the linear signal and the compression gain is calculated; and the predistortion signal is generated based on the loudspeaker model parameter and the product. In this solution, the electronic device compresses the linear signal through the compression gain (a positive number less than or equal to 1) to obtain a compressed linear signal (namely, the product), and then generates the predistortion signal based on the speaker model parameter and the compressed linear signal, which can avoid that the predistortion signal is cut off due to the excessively large linear signal and can solve the problem that the predistortion signal obtained by the existing simplified feedforward controller is easy to be cut off.

It should be noted that the non-linear distortion compensation method provided in this embodiment of this application may be performed by a non-linear distortion compensation apparatus, or a function module and/or functional entity in the non-linear distortion compensation apparatus for performing the non-linear distortion compensation method. In this embodiment of this application, the non-linear distortion compensation apparatus provided in this embodiment of this application is described by using an example in which the non-linear distortion compensation apparatus performs the non-linear distortion compensation method.

Figure 8:
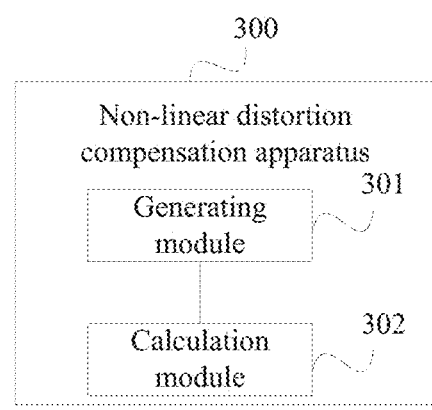
FIG. 8 is a schematic diagram of a structure of a non-linear distortion compensation apparatus according to an embodiment of this application.

FIG. 8 is a schematic diagram of a possible structure of a non-linear distortion compensation apparatus according to an embodiment of this application. As shown in FIG. 8, the non-linear distortion compensation apparatus 300 may include a generating module 301 and a calculation module 302; the generating module 301 is configured to: generate a linear signal based on an audio signal and a loudspeaker model parameter; and generate a compression gain based on the audio signal, the loudspeaker model parameter, and the linear signal; the calculation module 302 is configured to calculate a product of the linear signal and the compression gain; and the generating module 301 is further configured to generate a predistortion signal based on the loudspeaker model parameter and the product. The compression gain is a positive integer less than or equal to 1.

Optionally, the generating module 301 may be configured to: generate a non-linear amplitude based on the audio signal and the loudspeaker model parameter; and generate the compression gain based on a linear amplitude of the linear signal and the non-linear amplitude.

Optionally, the generating module 301 may be configured to: obtain a maximum linear amplitude based on the linear amplitude and a historical linear amplitude; obtain a maximum non-linear amplitude based on the non-linear amplitude and a historical non-linear amplitude; and calculate a ratio of the maximum non-linear amplitude to the maximum linear amplitude as the compression gain.

This embodiment of this application provides a non-linear distortion compensation apparatus, the linear signal may be generated based on the audio signal and the loudspeaker model parameter; the compression gain is generated based on the audio signal, the loudspeaker model parameter, and the linear signal; the product of the linear signal and the compression gain is calculated; and the predistortion signal is generated based on the loudspeaker model parameter and the product. In this solution, the non-linear distortion compensation apparatus compresses the linear signal through the compression gain (a positive number less than or equal to 1) to obtain a compressed linear signal (namely, the product), and then generates the predistortion signal based on the speaker model parameter and the compressed linear signal, which can avoid that the predistortion signal is cut off due to the excessively large linear signal and can solve the problem that the predistortion signal obtained by the existing simplified feed-forward controller is easy to be cut off.

The non-linear distortion compensation apparatus in this embodiment of this application may be an apparatus, or may be an electronic device or a component, an integrated circuit, or a chip in the electronic device. The electronic device may be a mobile electronic device, or may be a non-mobile electronic device. For example, the mobile electronic device may be a mobile phone, a tablet computer, a notebook computer, a palmtop computer, an in-vehicle electronic device, a wearable device, an ultra-mobile personal computer (UMPC), a netbook, a personal digital assistant (PDA), or the like. The non-mobile electronic device may be a server, a network attached storage (NAS), a personal computer (PC), a television (TV), a teller machine, a self-service machine, or the like. This is not specifically limited in the embodiments of this application.

The non-linear distortion compensation apparatus in this embodiment of this application may be an apparatus with an operating system. The operating system may be an Android operating system, an iOS operating system, or another possible operating system, which is not specifically limited in this embodiment of this application.

The non-linear distortion compensation apparatus provided in this embodiment of this application can implement the processes implemented in the method embodiment shown in FIG. 7, and a same technical effect can be achieved. To avoid repetition, details are not provided herein again.

Figure 9:
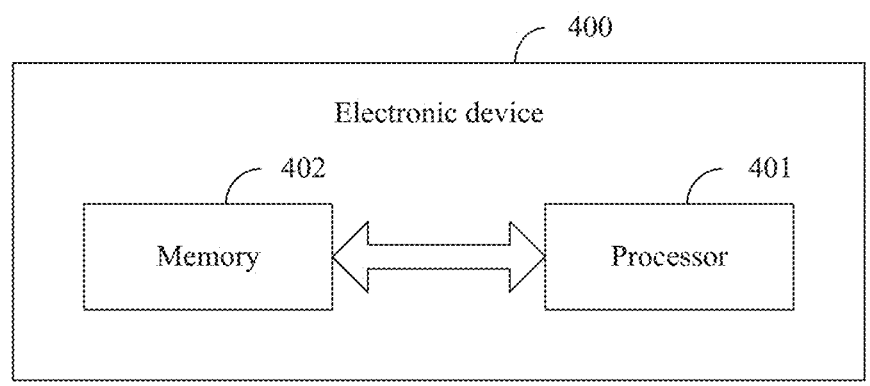
FIG. 9 is a schematic diagram of a structure of an electronic device according to an embodiment of this application.

Optionally, as shown in FIG. 9, an embodiment of this application further provides an electronic device 400, including a processor 401, a memory 402, and a program or an instruction stored in the memory 402 and executable on the processor 401. When the program or the instruction is executed by the processor 401, the processes of the foregoing non-linear distortion compensation method embodiment are implemented, and a same technical effect can be achieved. To avoid repetition, details are not described herein again.

It should be noted that the electronic device in the embodiments of this application includes the foregoing mobile electronic device and the foregoing non-mobile electronic device.

Figure 10:
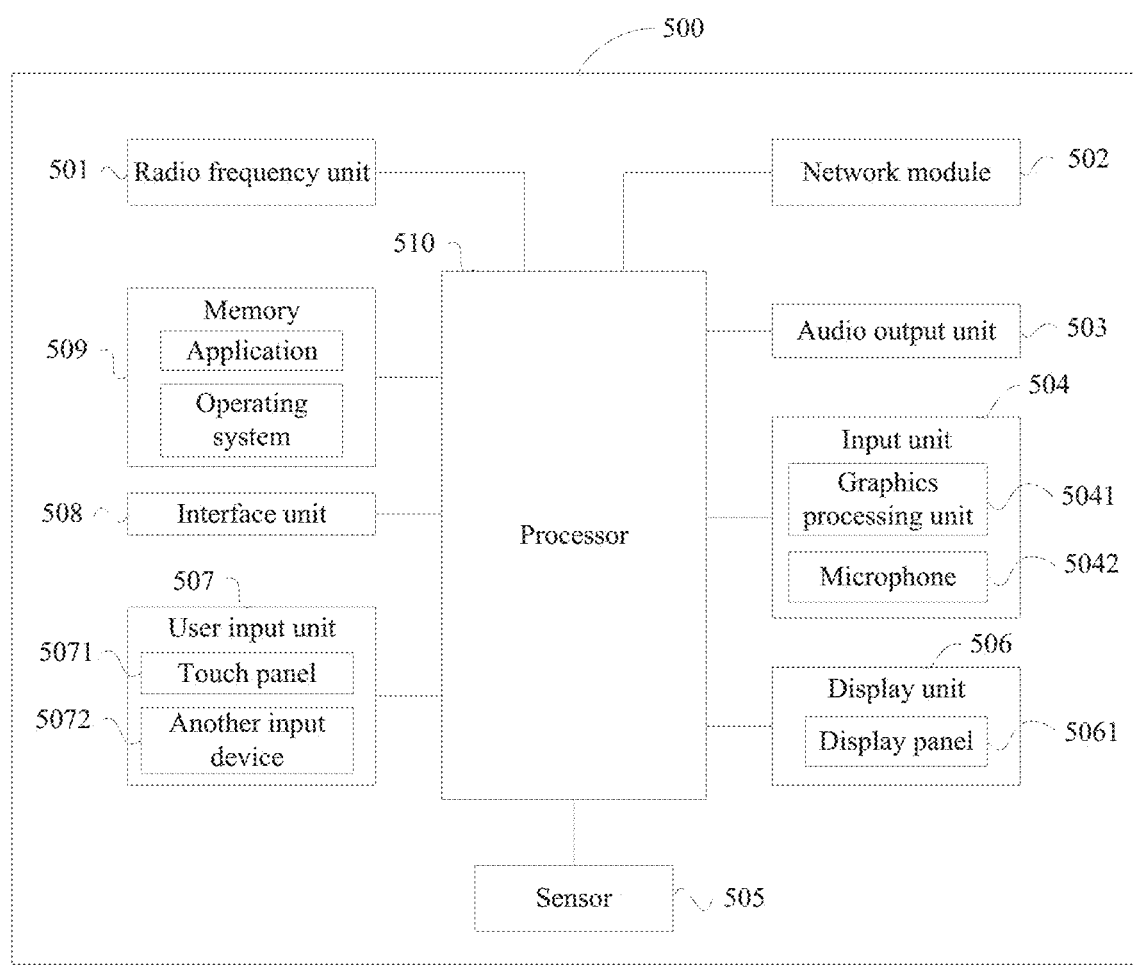
FIG. 10 is a schematic diagram of a hardware structure of an electronic device according to an embodiment of this application.

FIG. 10 is a schematic diagram of a hardware structure of an electronic device for implementing an embodiment of this application. The electronic device 500 includes, but is not limited to components such as a radio frequency unit 501, a network module 502, an audio output unit 503, an input unit 504, a sensor 505, a display unit 506, a user input unit 507, an interface unit 508, a memory 509, and a processor 510.

It may be understood by a person skilled in the art that the electronic device 500 may further include a power supply (such as a battery) that supplies power to each component. The power supply may be logically connected to the processor 510 by using a power management system, to implement functions such as charging, discharging, and power consumption management by using the power management system. A structure of the electronic device shown in FIG. 10 does not constitute a limitation on the electronic device, and may include more or fewer components than those shown in the figure, or combine some components, or have different part arrangements. Details are not described herein again.

The processor 510 is configured to: generate a linear signal based on an audio signal and a loudspeaker model parameter; generate a compression gain based on the audio signal, the loudspeaker model parameter, and the linear signal, calculate a product of the linear signal and the compression gain; and generate a predistortion signal based on the loudspeaker model parameter and the product. The compression gain is a positive integer less than or equal to 1.

Optionally, the processor 510 may be configured to: generate a non-linear amplitude based on the audio signal and the loudspeaker model parameter; and generate the compression gain based on a linear amplitude of the linear signal and the non-linear amplitude.

Optionally, the processor 510 may be configured to: obtain a maximum linear amplitude based on the linear amplitude and a historical linear amplitude; obtain a maximum non-linear amplitude based on the non-linear amplitude and a historical non-linear amplitude; and calculate a ratio of the maximum non-linear amplitude to the maximum linear amplitude as the compression gain.

In this embodiment of this application, the electronic device may generate a linear signal based on an audio signal and a loudspeaker model parameter; generate a compression gain based on the audio signal, the loudspeaker model parameter, and the linear signal; calculate a product of the linear signal and the compression gain; and generate a predistortion signal based on the loudspeaker model parameter and the product. In this solution, the electronic device compresses the linear signal through the compression gain (a positive number less than or equal to 1) to obtain a compressed linear signal (namely, the product), and then generates the predistortion signal based on the speaker model parameter and the compressed linear signal, which can avoid that the predistortion signal is cut off due to the excessively large linear signal and can solve the problem that the predistortion signal obtained by the existing simplified feed-forward controller is easy to be cut off.

It should be understood that, in this embodiment of this application, the radio frequency unit 501 may be configured to receive and send information or a signal in a call process. For example, after receiving downlink data from a base station, the radio frequency unit sends the downlink data to the processor 510 for processing. In addition, the radio frequency unit sends uplink data to the base station. In addition, the radio frequency unit 501 may further communicate with a network and another device through a wireless communications system. The electronic device provides wireless broadband Internet access for the user by using the network module 502, for example, helping the user to send and receive an e-mail, brows a web page, and access streaming media. The audio output unit 503 may convert audio data received by the radio frequency unit 501 or the network module 502 or stored in the memory 509 into an audio signal and output the audio signal as sound. In addition, the audio output unit 503 may further provide an audio output (for example, a call signal received voice, or a message received voice) related to a specific function implemented by the electronic device 500. The input unit 504 may include a graphics processing unit (GPU) 5041 and a microphone 5042, and the graphics processing unit 5041 processes image data of a still picture or video obtained by an image capture apparatus (such as a camera) in a video capture mode or an image capture mode. The display unit 506 may include a display panel 5061. Optionally, the display panel 5061 may be configured in a form such as a liquid crystal display or an organic light-emitting diode. The user input unit 507 includes a touch panel 5071 and another input device 5072. The touch panel 5071 is also referred to as a touchscreen. The touch panel 5071 may include two parts: a touch detection apparatus and a touch controller. The another input device 5072 may include but is not limited to a physical keyboard, a functional button (such as a volume control button or a power on/off button), a trackball, a mouse, and a joystick. Details are not described herein. The memory 509 may be configured to store a software program and various data, including but not limited to an application and an operating system. The processor 510 may be integrated with an application processor and a modem processor. The application processor mainly processes an operating system, a user interface, an application, and the like. The modem processor mainly processes wireless communication. It can be understood that, alternatively, the modem processor may not be integrated into the processor 510.

For the beneficial effects of the implementations in this embodiment, refer to the beneficial effects of the corresponding implementations in the foregoing method embodiments. To avoid repetition, details are not described herein again.

An embodiment of this application further provides a non-transitory readable storage medium, where the non-transitory readable storage medium stores a program or an instruction, and when the program or the instruction is executed by a processor, the processes of the foregoing non-linear distortion compensation method embodiment are implemented, and a same technical effect can be achieved. To avoid repetition, details are not described herein again.

The processor is a processor in the electronic device in the foregoing embodiment. The non-transitory readable storage medium includes a non-transitory computer-readable storage medium, such as a computer read-only memory (ROM), a random access memory (RAM), a magnetic disk, or an optical disc.

An embodiment of this application further provides a chip. The chip includes a processor and a communications interface, the communications interface is coupled to the processor, and the processor is configured to run a program or an instruction to implement the processes of the foregoing non-linear distortion compensation method embodiment, and a same technical effect can be achieved. To avoid repetition, details are not described herein again.

It should be understood that the chip mentioned in this embodiment of this application may also be referred to as a system-level chip, a system chip, a system on chip, a system chip on chip, and the like.

It should be noted that in this specification, the term "include", "comprise", or any other variant is intended to cover non-exclusive inclusion, so that a process, method, article, or apparatus that includes a series of elements includes not only those elements but also other elements that are not explicitly listed, or includes elements inherent to such a process, method, article, or apparatus. An element limited by "includes a . . . " does not, without more constraints, preclude the presence of additional identical elements in the process, method, article, or apparatus that includes the element. In addition, it should be noted that the scope of the method and the apparatus in the embodiments of this application is not limited to performing functions in an illustrated or discussed sequence, and may further include performing functions in a basically simultaneous manner or in a reverse sequence according to the functions concerned. For example, the described method may be performed in an order different from that described, and the steps may be added, omitted, or combined. In addition, features described with reference to some examples may be combined in other examples.

Based on the descriptions of the foregoing implementations, a person skilled in the art may clearly understand that the method in the foregoing embodiment may be implemented by software in addition to a necessary universal hardware platform or by hardware only. In most circumstances, the former is a preferred implementation. Based on such an understanding, the technical solutions of this application essentially or the part contributing to the prior art may be implemented in a form of a software product. The computer software product is stored in a storage medium (such as a ROM/RAM, a hard disk, or an optical disc), and includes several instructions for instructing a terminal (which may be mobile phone, a computer, a server, an air conditioner, a network device, or the like) to perform the methods described in the embodiments of this application.

The embodiments of this application are described above with reference to the accompanying drawings, but this application is not limited to the above implementations, and the above implementations are only illustrative and not restrictive. Under the enlightenment of this application, those of ordinary skill in the art can make many forms without departing from the purpose of this application and the protection scope of the claims, all of which fall within the protection of this application.

What is claimed is:

1. A non-linear distortion compensation circuit, wherein the non-linear distortion compensation circuit comprises: a linear dynamic circuit, a gain module, a multiplier, and a non-linear inverse dynamic circuit; and a first input terminal of the linear dynamic circuit is configured to input an audio signal, a second input terminal of the linear dynamic circuit is configured to input a loudspeaker model parameter, and an output terminal of the linear dynamic circuit is separately connected to a first input terminal of the gain module and a first input terminal of the multiplier; a second input terminal of the gain module is configured to input the audio signal, a third input terminal of the gain module is configured to input the loudspeaker model parameter, and an output terminal of the gain module is connected to a second input terminal of the multiplier; an output terminal of the multiplier is connected to a first input terminal of the non-linear inverse dynamic circuit; and a second input terminal of the non-linear inverse dynamic circuit is configured to input the loudspeaker model parameter, and an output terminal of the non-linear inverse dynamic circuit is connected to a loudspeaker, wherein the output terminal of the linear dynamic circuit is configured to output a linear signal, the output terminal of the gain module is configured to output a compression gain, the output terminal of the non-linear inverse dynamic circuit is configured to output a predistortion signal, the compression gain is used to compress the linear signal by using the multiplier, and the compression gain is a positive number less than or equal to 1.

2. The circuit according to claim 1, wherein the gain module comprises a non-linear amplitude module and a gain calculation module;

two input terminals of the non-linear amplitude module are the second input terminal of the gain module and the third input terminal of the gain module, and an output terminal of the non-linear amplitude module is connected to one input terminal of the gain calculation module; and another input terminal of the gain calculation module is the first input terminal of the gain module, and an output terminal of the gain calculation module is the output terminal of the gain module, wherein the output terminal of the non-linear amplitude module is configured to output a non-linear amplitude, and the gain calculation module is configured to obtain the compression gain through calculation based on a linear amplitude of the linear signal and the non-linear amplitude.

3. A non-linear distortion compensation apparatus, wherein the non-linear distortion compensation apparatus comprises the non-linear distortion compensation circuit according to claim 2.

4. The circuit according to claim 1, wherein the distortion compensation circuit further comprises at least one of following: a delay module or a power amplifier module;

after passing through the delay module, the audio signal is input to an input terminal of the linear dynamic circuit and the second input terminal of the gain module; and the output terminal of the non-linear inverse dynamic circuit is connected to the loudspeaker through the power amplifier module.

5. A non-linear distortion compensation apparatus, wherein the non-linear distortion compensation apparatus comprises the non-linear distortion compensation circuit according to claim 4.

6. A non-linear distortion compensation apparatus, wherein the non-linear distortion compensation apparatus comprises the non-linear distortion compensation circuit according to claim 1.

7. A non-linear distortion compensation method, wherein the method comprises:

generating a linear signal based on an audio signal and a loudspeaker model parameter;

generating a compression gain based on the audio signal, the loudspeaker model parameter, and the linear signal;

calculating a product of the linear signal and the compression gain; and generating a predistortion signal based on the loudspeaker model parameter and the product, wherein the compression gain is a positive integer less than or equal to 1.

8. The method according to claim 7, wherein the generating a compression gain based on the audio signal, the loudspeaker model parameter, and the linear signal comprises:

generating a non-linear amplitude based on the audio signal and the loudspeaker model parameter; and generating the compression gain based on a linear amplitude of the linear signal and the non-linear amplitude.

9. The method according to claim 8, wherein the generating the compression gain based on a linear amplitude of the linear signal and the non-linear amplitude comprises:

obtaining a maximum linear amplitude based on the linear amplitude and a historical linear amplitude;

obtaining a maximum non-linear amplitude based on the non-linear amplitude and a historical non-linear amplitude; and calculating a ratio of the maximum non-linear amplitude to the maximum linear amplitude as the compression gain.

10. A non-transitory readable storage medium, wherein the non-transitory readable storage medium stores a program or an instruction, and when the program or the instruction is executed by a processor, the non-linear distortion compensation method according to claim 9 is implemented.

11. A chip, wherein the chip comprises a processor and a communications interface, the communications interface is coupled to the processor, and the processor is configured to run a program or an instruction to implement the non-linear distortion compensation method according to claim 9.

12. A non-transitory readable storage medium, wherein the non-transitory readable storage medium stores a program or an instruction, and when the program or the instruction is executed by a processor, the non-linear distortion compensation method according to claim 8 is implemented.

13. A chip, wherein the chip comprises a processor and a communications interface, the communications interface is coupled to the processor, and the processor is configured to run a program or an instruction to implement the non-linear distortion compensation method according to claim 8.

14. A non-transitory readable storage medium, wherein the non-transitory readable storage medium stores a program or an instruction, and when the program or the instruction is executed by a processor, the non-linear distortion compensation method according to claim 7 is implemented.

15. A chip, wherein the chip comprises a processor and a communications interface, the communications interface is coupled to the processor, and the processor is configured to run a program or an instruction to implement the non-linear distortion compensation method according to claim 7.

16. An electronic device, wherein the electronic device comprises a processor, a memory, and a program or an instruction stored in the memory and executable on the processor, and the program or the instruction, when executed by the processor, causes the electronic device to perform:

generating a linear signal based on an audio signal and a loudspeaker model parameter;

generating a compression gain based on the audio signal, the loudspeaker model parameter, and the linear signal;

calculating a product of the linear signal and the compression gain; and generating a predistortion signal based on the loudspeaker model parameter and the product, wherein the compression gain is a positive integer less than or equal to 1.

17. The electronic device according to claim 16, wherein the program or the instruction, when executed by the processor, causes the electronic device to perform:

generating a non-linear amplitude based on the audio signal and the loudspeaker model parameter; and generating the compression gain based on a linear amplitude of the linear signal and the non-linear amplitude.

18. The electronic device according to claim 17, wherein the program or the instruction, when executed by the processor, causes the electronic device to perform:

obtaining a maximum linear amplitude based on the linear amplitude and a historical linear amplitude;

obtaining a maximum non-linear amplitude based on the non-linear amplitude and a historical non-linear amplitude; and calculating a ratio of the maximum non-linear amplitude to the maximum linear amplitude as the compression gain.

* * * * *